United States Patent Office 2,993,817

Patented July 25, 1961

2,993,817

METHODS FOR THE PRODUCTION OF SEMI-CONDUCTOR JUNCTION DEVICES

John Isaac Carasso, 59 Teignmouth Road, Cricklewood, London NW. 2, England, and Eric Alfred Speight, 39 Braemar Ave., Wimbledon Park, London SW. 19, England No Drawing. Filed Feb. 25, 1957, Ser. No. 641,811
Claims priority, application Great Britain Feb. 23, 1956
1 Claim. (Cl. 148—1.5)

This invention relates to methods for the production of semi-conductor junction devices, for example, junction diodes and triodes and has particular reference to the production of such devices having the ability to operate at high frequencies of the order of megacycles per second.

One method of producing junction devices having the ability to operate at high frequencies includes effecting a reduction of the lifetime of minority carriers in the device. Thus, with germanium semi-conductor junction devices, it has been proposed to decrease the lifetime of the minority carriers by introducing into the germanium a sufficiency of certain chemical impurities, of which nickel is one of the most effective at present known, able to bring about the required increase in carrier recombination rate. It is of the utmost importance to be able to control the amount of such impurities (known as "deathnium" impurities) introduced into the semi-conductor since any deficiency below the required amount may result in failure to achieve the desired object whilst any excess may bring about undesirable side effects; for instance, in the case of a diode, it may increase the forward resistance of the device or decrease its reverse resistance.

One method at present used for introducing known small amounts of an impurity into germanium consists of adding the impurity directly to a melt from which the crystal of germanium is to be prepared. Another method consists of bringing the impurity into surface contact with the germanium, for example by electro-depositing a thin layer of the desired impurity on a wafer of germanium, and heating the combination to such a temperature and for such a time as to enable the impurity to diffuse into the germanium to the required extent. It has been found however that neither of these methods yields entirely satisfactory results particularly when the impurity in question is nickel owing to a number of special features of the nickel-germanium system.

It is an object of the present invention to provide an improved method for the production of semi-conductor junction devices suitable for use at high frequencies.

According to the present invention, a method for the production of semi-conductor junction devices includes the step of incorporating into an alloying material used to convert a predetermined region of the semi-conductor material from one type of conductivity to the other a quantity of a deathnium impurity sufficient to reduce the lifetime of minority carriers in the device to a required value.

When the semi-conductor material is germanium and the alloying material is indium a suitable deathnium material is nickel.

In one particular method according to the invention, a block of n-type conductivity germanium with a quantity of nickel-treated indium is heated to a temperature sufficient to cause a desired amount of nickel to diffuse into the germanium. After that treatment the combination consists of a block of germanium on one side of which a predetermined region has been converted to p-type conductivity, and at least that portion of the n-type conductivity material immediately adjacent to the p-type conductivity region is "doped" with nickel. The block is next provided with a non-rectifying contact on the side of the block opposite to that having the p-type conductivity region by once again heating it, this time to a temperature lower than the first treatment temperature, in contact with a small amount of solder which is itself in contact with an electrode whose conductivity is of the metallic type, for example a strip or disc of nickel or of the material known under the registered trademark Kovar. All heat treatment operations should be performed under non-oxidising conditions and preferably in an atmosphere of hydrogen.

More particularly, in one method according to the invention, the indium alloying material is prepared from indium wire which is rolled to a thickness of 25 to 100 microns, degreased with organic solvents, brightened by momentary immersion in a solution consisting of equal parts of concentrated nitric and hydrochloric acids, rinsed, and electro-plated with nickel using standard nickel-plating techniques until a thickness between 0.1% and 1.0% of the thickness of the indium strip has been deposited. The nickel-plated indium strip is next cut or punched into pieces of a required weight (for example of 0.1 to 10 milligrammes for most low-power applications) which are spheroidized by heating to 850° C. in a pure hydrogen atmosphere. One indium-nickel sphere is placed in contact with a germanium element of suitable resistivity (for example, 0.5 to 10 ohm cm., n-type) and the combination heated to a required temperature, of from 600 to 850° C. according to the resistivity of the germanium element and the desired lifetime, for a period of from 1 to 15 minutes and then rapidly cooled to room temperature. A non-rectifying metallic contact is next secured to the opposite side of the germanium element by placing that side upon a piece of antimonial solder, rolled to a thickness of 25 to 50 microns and cut or punched into pieces of an area similar to that of the germanium face to which it is desired to solder. The solder rests upon a strip or disc of nickel or material known under the registered trademark Kovar. The combination is heated to 550° C., maintained at that temperature until satisfactory wetting has taken place (a period of from ½ to 3 minutes usually) and then rapidly cooled to room temperature. Metallic leads to the indium drop and metal strip are then fixed in well known ways and the finished device is given a clean-up by a suitable chemical or electrolytic etching process.

A batch of semi-conductor diodes prepared by a method according to the invention, using germanium of resistivity approximately 2 ohm cm., treated at 740° C. exhibited an average reverse saturation current of 3.0 microamps whereas a control batch alloyed at 600° C., in which appreciable diffusion of nickel into the germanium element was avoided, had an average reverse saturation current of only 0.3 microamp. Since the resistivity of the material is not appreciably affected by this treatment as is evidenced by the maximum back voltage (60 to 90 volts for both batches) it is apparent that a considerable reduction in the lifetime of the minority carriers of the batch alloyed at 740° C. has taken place as compared with that of the other batch. This reduction would appear to be as large as two orders of magnitude on the assumption that the theory of W. Shockley (Bell System Technical Journal 88, 1949, 101) is quantitatively valid down to these very low levels of lifetime. The inference is confirmed by considerations based on the known solubility of nickel in germanium at various temperatures and by measurements of hole storage effects on the complete device.

Although processes according to the invention have been described above as applied to germanium of n-type conductivity in conjunction with indium and nickel it will be understood that the invention may be applied to other semi-conductor materials such as silicon and silicon-germanium alloys in conjunction with other suitable alloying materials and deathnium materials.

We claim:

A method of producing a germanium semi-conductor junction device which comprises the steps of electroplating an indium body with nickel to a plating thickness of between 0.1% and 1.0% of the thickness of the indium body, cutting a disc from the electroplated body, heating the electroplated disc in a hydrogen atmosphere to a temperature of 850° C. to spheroidize the disc, placing this sphere on a germanium block, heating the sphere and block in an atmosphere of hydrogen to a temperature lying within the range 600° to 850° C. for a period of from 1 to 15 minutes and cooling the resultant combination rapidly to room temperature.

References Cited in the file of this patent

UNITED STATES PATENTS

| | | |
|---|---|---|
| 2,774,695 | Burton | Dec. 18, 1956 |
| 2,778,802 | Willardson et al. | Jan. 22, 1957 |
| 2,781,481 | Armstrong | Feb. 12, 1957 |
| 2,813,233 | Shockley | Nov. 12, 1957 |
| 2,827,436 | Bemski | Mar. 18, 1958 |
| 2,829,422 | Fuller | Apr. 8, 1958 |
| 2,842,831 | Pfann | July 15, 1958 |
| 2,887,416 | Van Amstel | May 19, 1959 |
| 2,887,417 | Blanks | May 19, 1959 |